United States Patent [19]

Ishikawa

[11] 4,195,283
[45] Mar. 25, 1980

[54] METHOD FOR CONVERTING AN ANALOG VOLTAGE TO A DIGITAL VALUE FREE FROM CONVERSION ERRORS, AND AN INTEGRATING TYPE ANALOG-TO-DIGITAL CONVERTER CAPABLE OF ELIMINATING CONVERSION ERRORS

[76] Inventor: Masaoki Ishikawa, 8-8-14, Tsukimino, Yamato-shi, Kanagawa-ken, Japan

[21] Appl. No.: 930,011

[22] Filed: Aug. 1, 1978

[30] Foreign Application Priority Data

Aug. 9, 1977 [JP] Japan .................................. 52-95353

[51] Int. Cl.² .......................................... H03K 13/20
[52] U.S. Cl. ............................................. 340/347 NT
[58] Field of Search .................. 340/347 NT, 347 AD

[56] References Cited

U.S. PATENT DOCUMENTS

| | | | |
|---|---|---|---|
| 3,828,347 | 8/1974 | Sacks | 340/347 NT |
| 3,872,466 | 3/1975 | Wold | 340/347 NT |
| 3,942,173 | 3/1976 | Wold | 340/347 NT |
| 4,063,236 | 12/1977 | Amemiya | 340/347 NT |
| 4,081,800 | 3/1978 | Amemiya | 340/347 NT |

*Primary Examiner*—Charles D. Miller
*Attorney, Agent, or Firm*—Frishauf, Holtz, Goodman and Woodward

[57] ABSTRACT

An integrating type analog-to-digital converter is provided which finds in the first conversion cycle an analog-to-digital conversion value including a possible conversion error resulting from offset voltage applies an unknown voltage to an inverting amplifier in a second conversion cycle to find an analog-to-digital conversion value including a possible conversion error like the unknown voltage so polarity-inverted, and finds a sum of both the conversion values to thereby obtain a correct digital-to-analog conversion value free from conversion errors resulting from offset voltage etc. of an integrator. N reference voltage is overlapped with respect to the unknown voltage and conversion around zero is continuous. The converter permits a bipolar operation using a signal-polarity reference voltage.

18 Claims, 18 Drawing Figures

FIG. 4

|  |  | I-1 | I-2 | I-2' | II-1 | II-2 | II-2' |
|---|---|---|---|---|---|---|---|
| $A_1$ | $S_1$ | O | X | X | X | X | X |
| | $S_2$ | X | X | O | X | X | O |
| | $S_3$ | X | O | X | O | O | X |
| $A_2$ | $S_4$ | X | X | X | O | X | X |
| | $S_5$ | X | O | X | X | O | X |
| | $S_6$ | O | X | O | X | X | O |

X : DISABLE
O : ENABLE

FIG. 5

| PHASE | I-1 | I-2 | I-2' | II-1 | II-2 | II-2' |
|---|---|---|---|---|---|---|
| INPUT VOLTAGE TO $A_1$ | $E_x$ | 0 | $E_r$ | 0 | 0 | $E_r$ |
| INPUT VOLTAGE TO $A_2$ | 0 | $E_r$ | 0 | $E_x$ | $E_r$ | 0 |

F I G. 8
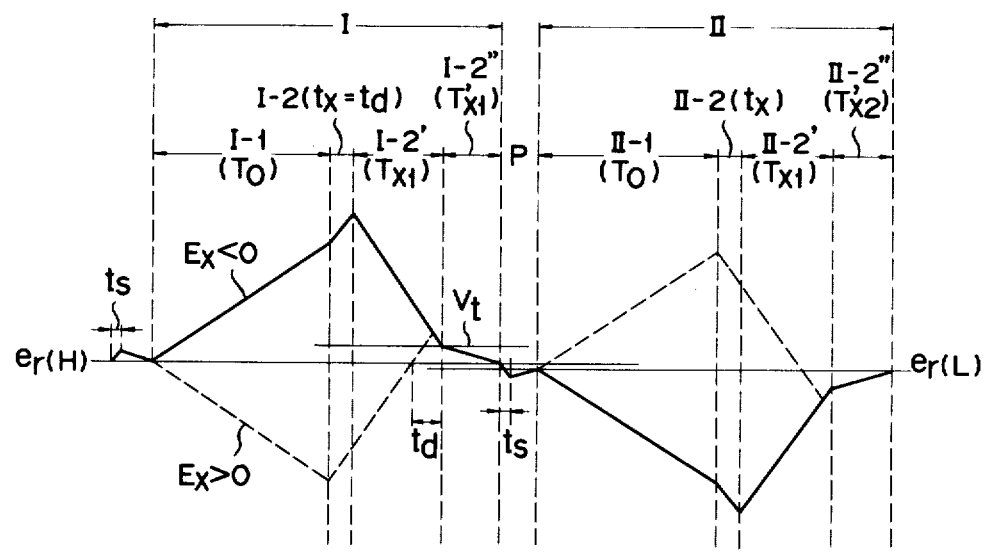

4,195,283

METHOD FOR CONVERTING AN ANALOG VOLTAGE TO A DIGITAL VALUE FREE FROM CONVERSION ERRORS, AND AN INTEGRATING TYPE ANALOG-TO-DIGITAL CONVERTER CAPABLE OF ELIMINATING CONVERSION ERRORS

BACKGROUND OF THE INVENTION

1. Field of the Invention

This invention relates to a method for converting analog voltage to digital voltage, as well as an analog-to-digital converter. In particular, this invention relates to a method for digitally eliminating offset voltage errors etc. as well as an integrating type analog-to-digital converter particularly suitable for LSI version.

2. Description of the Prior Art

An analog-to-digital converter including a means for digitally eliminating conversion errors resulting from offset voltage is disclosed in U.S. Pat. No. 3,872,466 specification. The analog-to-digital converter has various excellent advantages. For example, it suffers no hysteresis and propagation delay of a comparator in the converter. A reference voltage necessary for conversion may be of a unipolar type and is suited to LSI version. Conversion around zero is continuous. The converter suffers no influence resulting from offset voltage of an integrator etc. However, such a convertor is susceptible to averse influence of dielectric absorption and insulative resistance of an integrating capacitor, because an unknown analog voltage and reference voltage are superposed one over the other. For the positive and negative unknown analog voltages the output waveform of the integrator in the converter is completely asymmetric with respect to the time base. Therefore, there is a cause for noncoincidence between the absolute values of a conversion value of the unknown analog voltages having an opposite polarity and equal absolute value. The zero point of the converter is continuous, but there also exists a cause for difficulty of obtaining an accurate zero point. The integration time to the unknown analog voltage varies dependent upon the magnitude of offset voltage errors and thus is not constant.

SUMMARY OF THE INVENTION

An object of this invention is to provide an integrating type analog-to-digital converter capable of eliminating conversion errors resulting from an integrator offset voltage etc.

Another object of this invention is to provide an analog-to-digital converter capable of providing continuous and accurate zero point.

Another object of this invention is to provide an analog-to-digital converter capable of effecting a bipolar operation using a reference voltage of a single polarity.

Another object of this invention is to provide an analog-to-digital converter in which the conversion values of an unknown input voltage having equal absolute values, are accurately coincident and free from any conversion errors.

Another object of this invention is to provide an analog-to-digital converter whose accuracy is not influenced by the variation of circuit elements values to permit easy LSI version.

The conversion operation of the converter of this invention consists of two cycles: first and second conversion cycles. The converter is adapted to find in a first conversion cycle the analog-to-digital conversion value of an unknown voltage including possible conversion errors resulting from converter offset voltage etc.; to apply the unknown voltage to an inverting amplifier to find an analog-to-digital conversion value of the polarity-inverted voltage likewise including possible conversion errors; and find a sum of both the conversion values to obtain accurate digital-to-analog conversion value free from any conversion errors.

One feature of this invention resides in that the conversion error of the converter can be eliminated through a very simple operation of inverting an unknown voltage by the inverting amplifier during the second conversion cycle. Thus, no digital control operation is necessary. The converter does not include superposing a reference voltage onto the unknown input voltage and thus conversion around zero point of the unknown input voltage is continuous. Since for the positive and negative unknown voltages the output waveform of the integrator is symmetrical with respect to the time base, there exists a cause for errors resulting from the conversion of the negative and positive unknown voltages.

Each of the first and second conversion cycles is divided into a time period for integrating the unknown voltage of predetermined time duration and a time period for integrating a reference voltage. The time period for integrating the reference voltage is divided into a time phase over which a reference voltage is applied to an inverting amplifier, the reference voltage of opposite polarity is equivalently integrated and the output of the integrator always ends at the positive side of a comparison level, and a time phase which over a reference voltage is integrated. Since a comparison pulse necessary for comparison is generated when the integrator output crosses the comparison level only from the positive side, the converter suffers no influence from the hysteresis and response delay of the comparator. The time period for integrating the reference voltage always includes the time phase for equivalently integrating the positive and negative reference voltages and thus any incluence from the integrator's response delay etc. is cancelled. In the first conversion cycle the time involved in equivalently integrating the negative reference voltage is counted up by a reversible counter and the time involved in integrating the positive reference voltage is counted down. In the second conversion cycle, on the other hand, the time involved in equivalently integrating the negative reference voltage is counted down and the time involved in integrating the positive reference voltage is counted up. In this way, it is possible to obtain an accurate analog-to-digital conversion value of the unknown voltage. The sign is automatically obtained in pure digital fashion from the result of counting.

BRIEF DESCRIPTION OF THE DRAWING

FIG. 4 is a sequence diagram of an analog switch shown in FIG. 1;

FIG. 5 shows an unknown analog voltage and reference voltage applied to the inputs of amplifiers A1 and A2 in each phase of the conversion operation;

FIG. 8 is a waveform diagram for explaining the operation of FIG. 7.

DESCRIPTION OF THE PREFERRED EMBODIMENT

One circuit of an integrating type analog-to-digital converter according to this invention will be explained in more detail.

Figure 1:
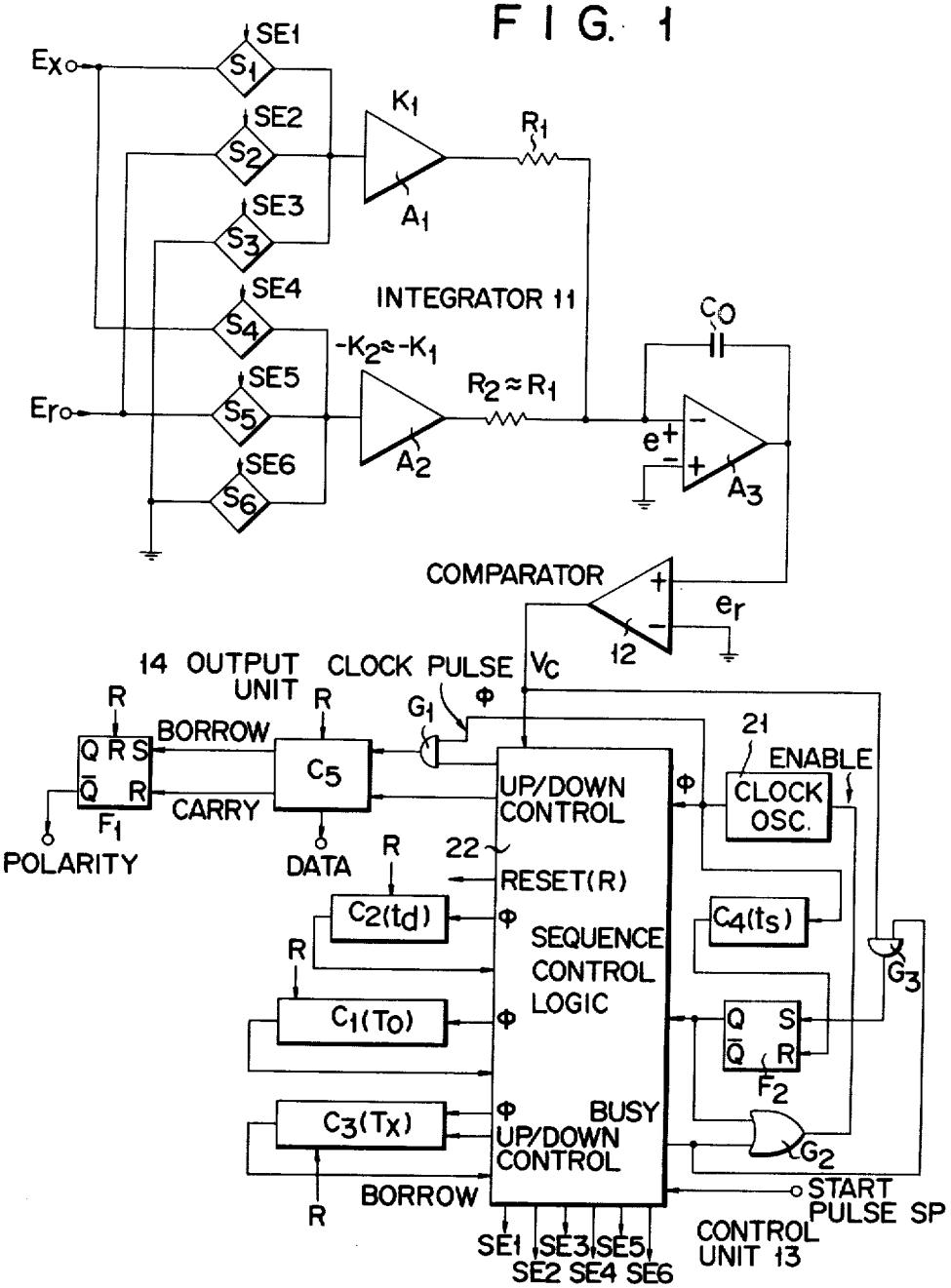
FIG. 1 is a block diagram showing one form of circuit of an integrating type analog-to-digital converter according to one embodiment of this invention.

FIG. 1 shows a circuit diagram of this embodiment. An analog-to-digital converter comprises a group of six switches S1 to S6, a noninverting amplifier A1, inverting amplifier A2, a 2-input, addition type, integrator 11, comparator 12, controller 13 and output unit 14. The outputs of the analog switches S1, S2 and S3 are connected in common to each other and then connected to the noinverting amplifier A1. The inputs of the switch S1, S2 and S3 are connected to an unknown analog voltage Ex, reference voltage Er and ground potential, respectively. The outputs of the analog switch S4, S5 and S6 are connected in common with each other and then connected to the input of the inverting amplifier A2. The inputs of the switches S4, S5 and S6 are connected to the unknown analog voltage Ex, reference voltage Er and ground potential, respectively. The 2-input, additive type, integrator comprises feedback resistors R1 and R2 and feedback capacitor C0. The input terminal of the resistor R1 is connected to the output of the noninverting amplifier A1 and the input terminal of the resistor R2 is connected to the output of the inverting amplifier A2. In this circuit the resistors R1 and R2 have resistive values closer to each other. The gains of the noninverting and inverting amplifiers A1 and A2 are K1 and −K2, respectively, whose absolute values have values closer to each other.

The noninverting input terminal of the amplifier A3 of the integrator is grounded, the output of the integrator is connected to the noninverting input terminal of the comparator 12 and the inverting input terminal of the comparator 12 is grounded. The output of the comparator is connected to the controller 13. The controller 13 comprises a clock oscillator 21, counter C1, counter C2, reversible counter C3 and sequence control logic circuit 22. Outputs SE1, SE2, SE3, SE4, SE5 and SE6 generated from the control logic circuit 22 are connected as switch drive signals to the switches S1 . . . S6, respectively. The output unit 14 is connected to the controller 13.

The conversion operation will be explained by referring to the output waveform of the integrator as shown in FIG. 2(A).

The conversion operation comprises a first conversion cycle consisting of phases I-1, I-2 and I-2' and adapted to effect integration during the phase I-1 to find a conversion value, and a second conversion cycle consisting of phases II-1, II-2 and II-2' and adapted to apply an input voltage to an inverting amplifier and integrate the polarity-inverted voltage during the phase II-1 to find a conversion value. The phase I-2 and I-2' in the first conversion cycle and phases II-2 and II-2' in the second conversion cycle are phases for integrating the reference voltages.

Figure 2:
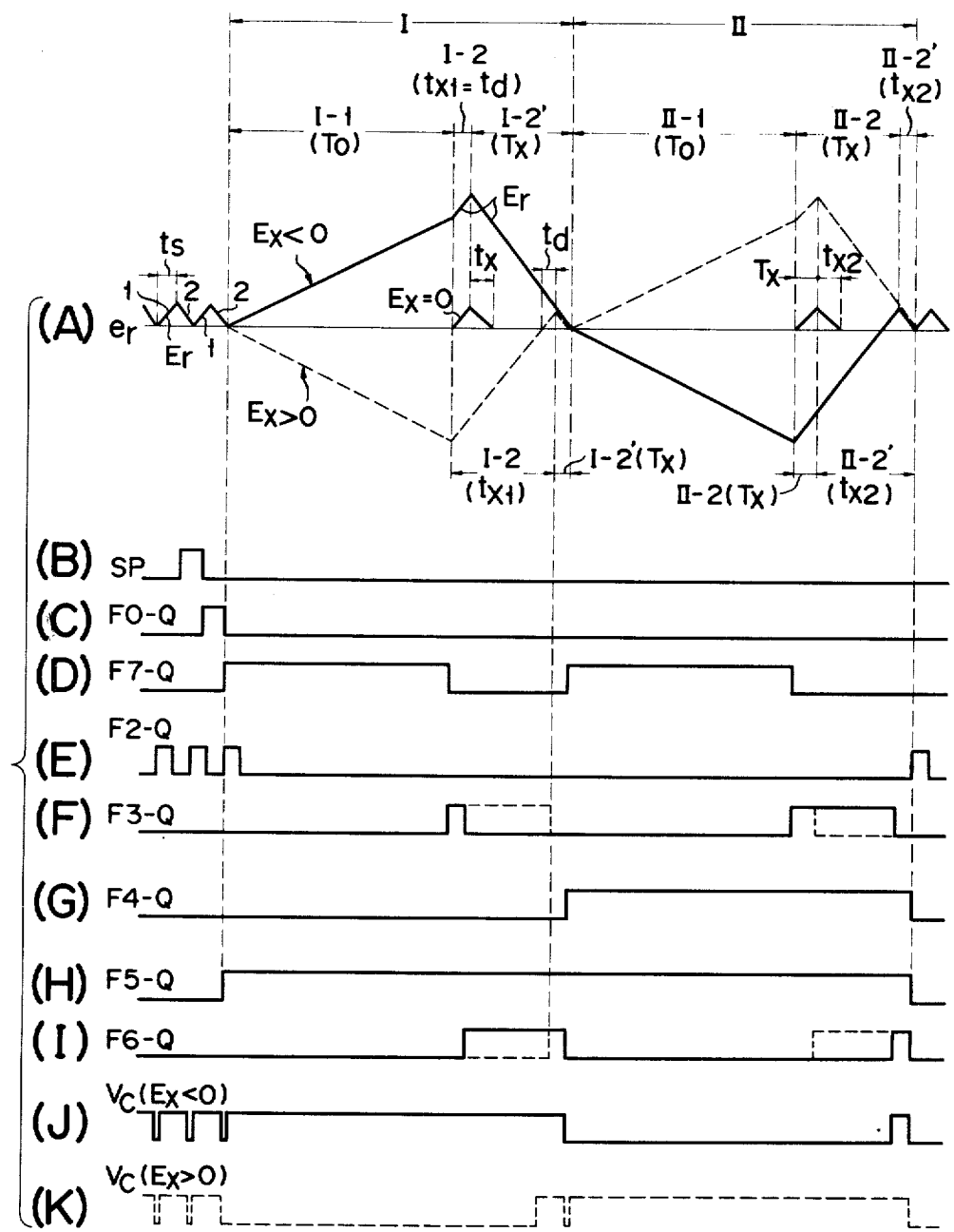
FIG. 2 (comprised of A-K) is a waveform diagram for explaining the converter of FIG. 1.

The conversion operation is initiated at the start of the phase I-1, but before the conversion operation is started the integrator 11 of FIG. 1 generates an output waveform as indicated by 1 and 2 in FIG. 2(A). The output waveform of the integrator is repetitively generated in a continuous fashion. The waveforms 1 and 2 are generated dependent upon the opened and closed states of the switches S1 to S6 which correspond to the phases I-2 and I-2' of the conversion cycle as will be explained later. That is, the output waveforms of the integrator 11 during the phases I-2 and II-2, respectively, are the same but different in their periods only. When no conversion operation is effected, the control (enable) terminal of the clock oscillator 21 is at the "1" (HIGH) level and the oscillator 21 is being continuously run. When the counter C4 counts clock pulses and a overflow pulse occurs after time $t_s$, a flip-flop F2 is reset and the output signal of the flip-flop F2 is supplied through the gate G2 to the control terminal of a clock oscillator 21 to cause the latter to become a "0" (LOW) level. Thus, the clock oscillator stops its oscillation. At this moment a waveform 2 is initiated and when the integrator output crosses a comparison level $e_r$ of the comparator a comparison pulse is generated to cause the flip-flop F2 to be set. At this mement the clock oscillator 21 resumes its oscillation. If a conversion instruction start pulse is generated before the oscillator resumes its oscillation, the conversion cycle is effected the moment the oscillator resumes its oscillator. In this way, the phase I-1 is started. When the conversion cycle is so started a BUSY signal is generated from the sequence control circuit 22 to cause the gate G3 to be disabled. As a result, the setting of the flip-flop F2 by the comparison pulse CP and the stopping of oscillation are avoided. The phase I-1 is a period for integrating an unknown voltage. Because as shown in FIG. 4 the switches S1 and S6 are closed and the remaining switches opened, in the phase I-1 the unknown voltage is connected to the amplifier A1 and the input of the amplifier A2 is grounded. In consequence, the integrator 11 integrates the unknown voltage Ex amplified by the noninverting amplifier A1. The output waveform of the integrator takes on an ascending straight line as indicated by solid lines in FIG. 2 when Ex is a negative value and a descending straight line as indicated in dotted lines in FIG. 2 when Ex is a positive value. When the absolute value of Ex is very small the polarity of the slope of the output waveform is not unconditionally determined, in the case of the polarity of the unknown voltage, due to the presence of offset voltages of the amplifiers A1 and A2 and integrator 11. In consequence, the polarity of the output of the integrator 11 at the end of the phase I-1 is not unconditionally determined. At the same time when the phase I-1 is started the counter C2 starts to count clock pulses $\phi$ and at the lapse of time T0 the counter C2 generates an overflow pulse. At this instant the phase I-1 is terminated and a phase I-2 started. The phase I-2 and the subsequent phase I-2' are periods for integrating reference voltages. In the phase I-2 the switches S3 and S5 are closed and the remaining switches opened. In consequence, the input of the amplifier A1 is grounded and the reference voltage Er is connected to the input of the inverting amplifier A2. The converter of this invention uses only the reference voltage Er of positive polarity and in this phase the polarity of the reference voltage Er is inverted by the amplifier A2 and the reference voltage of equivalently negative polarity is applied to the integrator 11. In consequence, the integrator output during the phase I-2 always takes on an ascending straight line irrespective of the polarity of the unknown voltage. The moment the first phase is terminated the sequence control circuit 22 detects the polarity of the comparator 12. When the positive polarity is involved the sequence control circuit 22 sends the clock pulse $\phi$ to the counter C2 and the counter C2 starts its counting operation so that a time width $t_d$ is generated. When, on the other hand, the negative polarity is involved the output of the integrator 11 rises and the moment it crosses the comparison level $e_r$, the polarity of the output of the comparator 12 is inverted to the positive polarity. At this moment the counter C2 starts its counting operation. When the counter C2 generates an overflow pulse the phase I-2 is terminated and the phase I-2' started. The counting capacity of the counter is so determined that it generates a time width $t_d$. The presence of the time $t_d$ assures that the comparator output at the end of the phase I-2 always becomes a "1" (HIGH) level. Since during the phase II-2' the switches S2 and S6 are closed and the other switches opened as shown in FIG. 4, the reference voltage Er is connected to the noninverting amplifier A1 and the input of the inverting amplifier A2 is grounded. In consequence, the output voltage of the integrator 11 falls and when the comparator 12 generates a comparison pulse Vc the phase II-2' is terminated and thus the first conversion cycle is terminated. During the phase I-2' the sequence control circuit 22 sends an up control signal and clock pulse $\phi$ to the reversible counter C3. The counter C3 stores a time width Tx. Simultaneously with the end of the first conversion cycle the phase II-1 of the second conversion cycle is started. The phase is, like the phase I-1, a period for integrating the unknown voltage. The unknown voltage Ex is connected to the input of the inverting amplifier A2 and the integrator 11 integrates a polarity-inverted voltage of the unknown voltage. That is, during this phase the switches S3 and S4 are closed and the other switches opened. The phases II-2 and II-2' are periods for effecting the same switching operation as the phases I-2 and I-2' and integrating the reference voltage. A difference from the first conversion cycle is in that the phase II-2 is terminated with the same time duration as that, Tx, of the phase I-2'. The reversible counter C3 receives a down control signal and clock pulses from the sequence control circuit 22 and is counted down to generate a borrow pulse. The borrow pulse is sent to the sequence control circuit 22 and in this way the phase II-2 is terminated. Since the counter C3 stores the time width of the I-2' phase, the time of the II-2 phase is exactly the same as the time Tx of the I-2. At the end of the phase II-2' a comparison pulse Vc is delivered to the sequence control circuit 22, thus terminating one conversion cycle. Waveforms 1 and 2 are immediately generated in a continuous manner. By the generation of such waveforms, the time at which the conversion operation is started synchronizes with clock pulses and in consequence a switch adapted to permit the integrating capacitor for preparing an initial value to be discharged can be omitted. During the conversion operation the output of the gate G2 is maintained at the "1" level irrespective of the output of the flip-flop F2 and the oscillator 21 is continuously run. During the phases I-2 and II-2' an up control signal from the sequence control logic 22, and clock pulses $\phi$ from a gate G1, are sent to a reversible counter C5 of the output unit 14 and during the phase I-2' and II-2 a down control signal, and the clock pulses $\phi$ from the gate G1, are sent to the counter C5. In the first conversion cycle, the contents of the counter C5 are counted up during the time interval in which the integrator 11 equivalently integrates a negative reference voltage, and counted down during the time interval in which the integrator 11 equivalently integrates the positive reference voltage and in the second conversion cycle a reversed relation is involved, and in consequence the contents of the counter C5 indicate the result of counting which indicates an accurate analog-to-digital conversion value of the unknown voltage. The polarity of the unknown voltage is obtained in a pure digital way from the F1 output which is generated when a flip-flop F1 is reset and set by a carry and a borrow pulse from the counter C5. A comparison pulse generated at the end of the phase I-2' synchronizes with the clock pulse and the subsequent phase II-1 can prevent any asynchronous error of one count.

A conversion value is obtained in the following way.

An input-output relation of noninverting amplifier A1 and inverting amplifier A2 as shown in FIG. 1 is generally expressed as:

$$e_0 = k_1(e_i - e_1)$$

$$e_0 = -k_2(e_i - e_2)$$

where $e_0$: output voltage $k_1, k_2$: amplification $e_i$: input voltage $e_1, e_2$: offset voltage in terms of input Since the input voltages of the amplifiers A1 and A2 during each phase are shown as in FIG. 5, if the sum of integrating quantities in the phases I-1, I-2 and I-2' are given as zero, the following Equation is obtained ($tx_1$: the time length of the phase I-2, $tx_2$: the time length of the phase II-2', Tx: the time length of the phase I-2' and II-2, and T0: the time length of the phases I-1 and II-1).

$$-\frac{K_1(Ex - e_1) - e}{R_1 C_0} T_0 - \frac{K_1(-e_1) - e}{R_1 C_0} tx_1 - \frac{K_1(Er - e) - e}{R_1 C_0} Tx - \frac{-K_2(-e_2) - e}{R_2 C_0} T_0 - \frac{-K_2(Er - e_2)}{R_2 C_0} tx_1 - \frac{-K_2(-e_2) - e}{R_2 C_0} Tx = 0 \quad (1)$$

where e denotes the offset voltage of the integrator.

Rearranging Equation (1) yields:

$$-\frac{Ex - (e_1 + e/K_1)}{(R_1/K_1)C_0} T_0 + \frac{e_1 + e/K_1}{(R_1/K_1)C_0} tx_1 - \frac{Er - (e_1 + e/K_1)}{(R_1/K_1)C_0} Tx - \frac{e_2 - e/K_2}{(R_2/K_2)C_0} T_0 + \frac{Er - (e_2 - e/K_2)}{(R_2/K_2)C_0} tx_1 - \frac{e_2 - e/K_2}{(R_2/K_2)C_0} Tx = 0 \quad (2)$$

With $e_{1'} = e_1 + e/K_1$, $e_{2'} = e_2 - e/K_2$, $R_{1'} = R_1/K_1$ and $R_{2'} = R_2/K_2$, the following Equation is obtained:

$$-\frac{Ex - e_1'}{R_1'C_0} T_0 + \frac{e_1'}{R_1'C_0} tx_1 - \frac{Er - e_1'}{R_1'C_0} Tx - \frac{e_2'}{R_2'C_0} Tx + \quad (3)$$
$$\frac{Er - e_2'}{R_2'C_0} tx_1 - \frac{e_2'}{R_2'C_0} Tx = 0$$

Rearranging Equation (3) with $\xi = R_1'/R_2'$ gives:

$$-\frac{(Ex - e_1') + \xi e_2'}{R_1'C_0} T_0 + \frac{e_1' + \xi(Er - e_2')}{R_1'C_0} tx_1 - \quad (3')$$
$$\frac{Er - e_1' + \xi e_2'}{R_1'C_0} Tx = 0$$

Given $e' = e_1' - \xi e_2'$, the following equation is obtained:

$$(-Ex + e')T_0 + (\xi Er + e')tx_1 + (-Er + e')Tx = 0 \quad (4)$$

When the sum of integrating quantities in the phases II-1, II-2 and II-2' is given as zero, the following Equation is obtained:

$$-\frac{K_1(-e_1) - e}{R_1C_0} T_0 - \quad (5)$$
$$\frac{K_1(-e_1) - e}{R_1C_0} Tx - \frac{K_1(Er - e_1) - e}{R_1C_0} tx_2 -$$
$$\frac{-K_2(Ex - e_2) - e}{R_2C_0} T_0 - \frac{-K_2(Er - e_2) - e}{R_2C_0} Tx -$$
$$\frac{-K_2(-e_2) - e}{R_2C_0} tx_2 = 0$$

The above-mentioned Equation can be reduced to:

$$(\xi Ex + e')T_0 + (\xi Er + e')Tx + (=Er + e')tx_2 = 0 \quad (6)$$

from Equations (4) and (6), $$tx_1 = \frac{(Ex - e')T_0 + (Er - e')Tx}{\xi Er + e'} \quad (7)$$
$$tx_2 = \frac{(\xi Ex + e')T_0 + (\xi Er + e')Tx}{Er - e'} \quad (8)$$

Taking a sum of Equations (7) and (8) with $\alpha = e'/Er$ gives:

$$tx_1 + tx_2 = \left\{ \frac{Ex}{Er} \left( \frac{1}{\xi + \alpha} + \frac{\xi}{1 - \alpha} \right) + \quad (9) \right.$$
$$\left. \frac{\alpha}{1 - \alpha} - \frac{\alpha}{\xi + \alpha} \right\} T_0 + \left( \frac{1 - \alpha}{\xi + \alpha} + \frac{\xi + \alpha}{1 - \alpha} \right) Tx$$

Since $R_1$ and $R_2$ has closer with respect to each other and $K_1$ and $K_2$ closer values with respect to each other, if a very small amount of quadratic $\alpha$ and $\delta$ is disregarded with $\xi = 1 + \delta$ and $\alpha \ll 1$ and $\delta \ll 1$ or $e'$ is made for smaller than $Er$, then $$\frac{1}{\xi + \alpha} + \frac{\xi}{1 - \alpha} = \frac{1}{1 + \delta + \alpha} + \frac{1 + \delta}{1 - \alpha} = \quad (10)$$
$$1 - (\delta + \alpha) + (\delta + \alpha)^2 - \ldots + 1 + \alpha + \alpha^2 + \ldots +$$
$$\delta(1 + \alpha + \alpha^2 + \ldots) \approx 2$$

$$\frac{\alpha}{1 - \alpha} - \frac{\alpha}{\xi + \alpha} = \frac{\alpha}{1 - \alpha} - \frac{\alpha}{1 + \delta + \alpha} = \quad (11)$$
$$\alpha(1 + \alpha + \alpha^2 + \ldots) - \alpha\{1 - (\delta + \alpha) + (\delta + \alpha)^2 - \ldots\} \approx 0$$

$$\frac{1 - \alpha}{\xi + \alpha} + \frac{\xi + \alpha}{1 - \alpha} = \frac{1 - \alpha}{1 + \delta + \alpha} + \frac{1 + \delta + \alpha}{1 - \alpha} = \quad (12)$$
$$1 - (\delta + \alpha) + (\delta + \alpha)^2 + \ldots - \alpha\{1 - (\delta + \alpha) + (\alpha + \delta)^2 - \ldots\} + 1 + \alpha + \alpha^2 + (\delta + \alpha)(1 + \alpha +$$

$\alpha^2 + \ldots) \approx 2$

Substituting equation (10), (11) and (12) yields:

$$tx_1 + tx_2 \approx 2T_0 \cdot \frac{Ex}{Er} + 2tx \quad (12')$$

$$\frac{Ex}{Er} = \frac{tx_1 + tx_2 - 2Tx}{2T_0} \quad (13)$$

As explained, it follows that the reversible counter C5 counts up a time width of $tx_1 + tx_2$ and counts down a time width of 2Tx. Thus, the content of the counter C5 indicates an analog-to-digital conversion value of Equation (13). As shown by the result of calculation of Equation (13) all errors are cancelled out and there exists no cause for zero drift and gain drift and thus the conversion value is extremely accurate and stable. That is, the converter suffers no influence from the integrator's offset voltage e, resistors $R_1$ and $R_2$, amplifications $K_1$ and $K_2$ of the amplifiers $A_1$ and $A_2$, and offset voltages $e_1$ and $e_2$.

The time interval of the phase I-2 for integrating the reference voltage at least exceeds the time td. By the presence of the time td the output of the integrator always reaches the comparison level from the positive side and thus the converter suffers no comparator's hysteresis and response delay. Since the output level of the integrator is higher than the comparison level by the extent corresponding to the time td, it is possible to avoid a possible erroneous operation of the comparator as resulting from noises generated when the switches are operated at the commencement of the phases I-2' and II-2'. The time td is so selected dependent upon the magnitude of such noises and of various offset voltages that it is minimal. Therefore, the time td, though shown emphasized for convenience of explanation in FIG. 2(A), is sufficiently small compared with the conversion time. Since the time td is very small, the integrator output waveform at $Ex = 0$ suffers no influence from the dielectric absorption of the feedback cacacitor C0 in the integrator, as well as from the insulative resistor, and thus the zero point of the converter is very accurate. Equation (13) is established with respect to the negative and positive Ex and the zero point is continuous. This is due to the fact that the same operation is involved with respect to the negative and positive Ex. For the positive and negative unknown voltages, the operation waveform of the integrator becomes exactly symmetrical with respect to the time base if the first and second conversion cycles are interchanged and thus an exact coincidence of the conversion values occurs with respect to any unknown voltage which is opposite in polarity and equal in absolute value. Another excellent feature of this invention resides in that the time for integrating the reference voltage always include two phases, one in which the integrator output has a positive inclination and the other in which the integrator output has a negative inclination. This feature has the following advantage. The conversion value suffers no influence from the propagation delay of the analog switches, response delay of the amplifiers A1 and A2, response delay of the integrator, and so on. This is due to the fact that the response delays of the positive and negative gradient outputs of the integrator are cancelled out. In consequence, linearity around zero input is very good. The step responses of the amplifiers A1 and A2 are cancelled out without imparting any influence and thus the amplification of the amplifiers A1 and A2 is enhanced to permit a very small voltage to be directly converted with high accuracy.

When the offset voltage is sufficiently small, high accurate converter having the above-mentioned various advantages can be realized only through the first conversion cycle. The analog-to-digital converter using only a first conversion cycle constitutes another embodiment of this invention.

Figure 3:
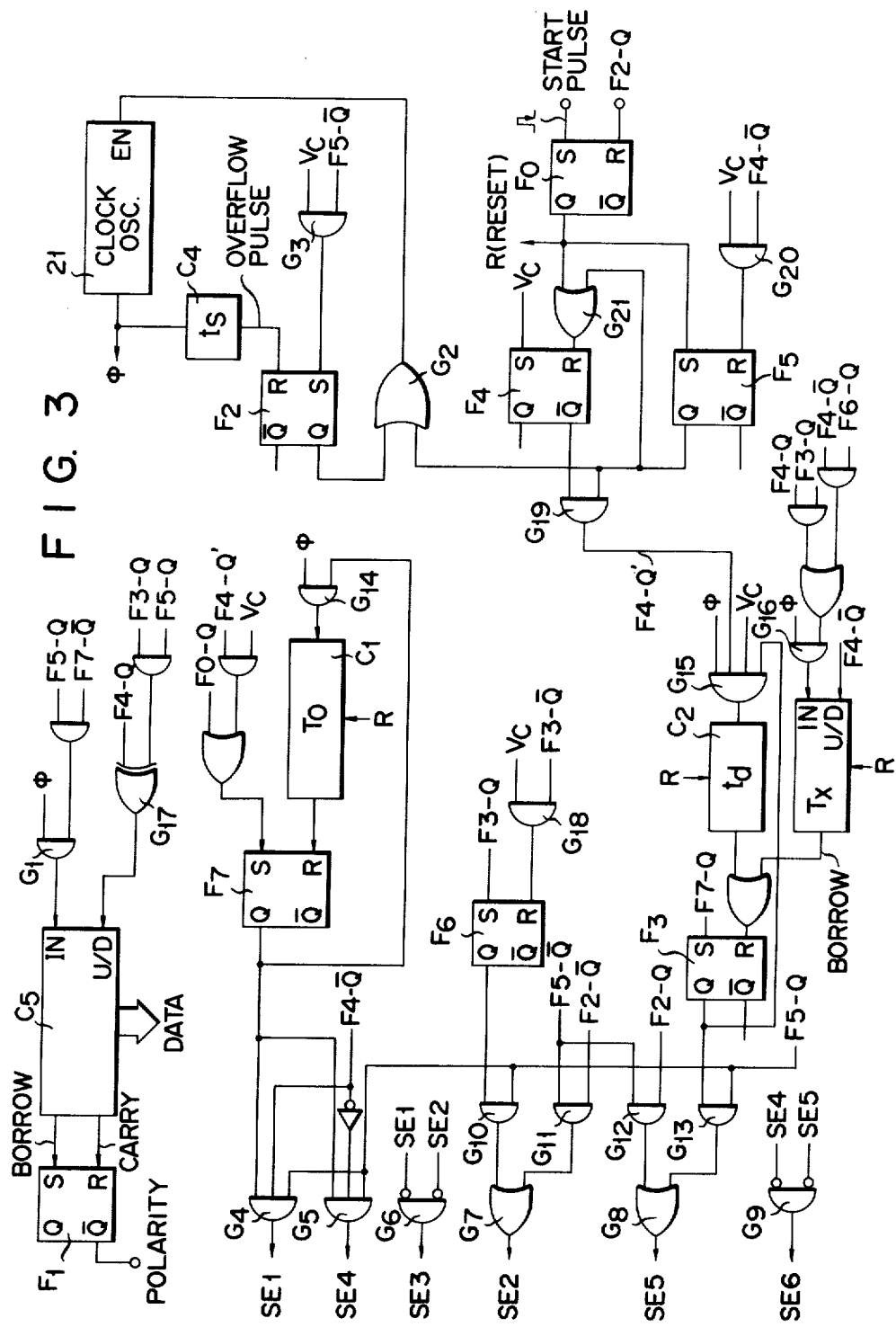
FIG. 3 is a detailed logic circuit of a sequence control logic circuit shown in FIG. 1.

The detail of the logic circuit is shown in FIGS. 3 flip-flops of FIG. 3 are all of a negative-edge triggered type. The counter C4 for measuring the time $t_s$ is adapted to generate an overflow pulse when clock pulses $\phi$ corresponding to the time $t_s$ are received from the clock oscillator 21. A flip-flop F2 is reset by the overflow pulse from the counter C4 with the result that the output F2-Q goes LOW. Since the F2-Q output of the flip-flop F2 is connected through OR gate G2 to an enable input of the clock oscillator 21 the oscillator 21 is disabled until the flip-flop F2 is set by the output of an AND gate G3. The output Vc of the comparator 12 and output F5-$\overline{Q}$ of a flip-flop F5 are coupled to the AND gate G3. The flip-flop F5 is set by the output F0-Q of the flip-flop F0 to the set input of which a conversion start pulse Sp is applied. During the conversion operation the output F5-Q of the flip-flop F5 is always at a HIGH level and thus during the period other than the conversion cycle the output F5-$\overline{Q}$ is always at a HIGH level. Because the output F5-Q of the flip-flop F5 is coupled to AND gates G4 and G5 which produce switch enable signals SE1 and SE4, the AND gates G4 and G5 are both disabled, before the conversion operation starts, causing the analog switches S1 and S4 of FIG. 1 to be disabled. The output F5-Q of the flip-flop F5 is coupled to an AND gate 10 whose output is connected to an OR gate G7 for generating the switch control signal SE2, and to an AND gate G13 whose output is connected to an OR gate G8 for generating the switch control signal SE5. Therefore, during the period other than the conversion cycle the outputs of the gates G10 and G13 are always at a LOW level. The outputs F5-$\overline{Q}$ and F2-$\overline{Q}$ are coupled to an AND gate G11 whose output is connected to the OR gate G7. During the operation period of the clock oscillator 21, the output F2-$\overline{Q}$ is at LOW level and thus the output of the gate G11 is at LOW level. Because the outputs of gates G10 and G11 are both at LOW level, the output of OR gate G7 is at LOW level. That is, during the period other than the conversion cycle the analog switch S2 is always disabled. During the operation period of the clock oscillator the output of AND gate G12 is at HIGH level, because the outputs F2-Q and F5-$\overline{Q}$ are both at HIGH level. In consequence, the output of OR gate becomes HIGH, causing the analog switch S5 to be enabled. Since at this time the signals SE1 and SE2 are both LOW as already set out above, the output of an NAND gate G6 for generating the switch control signal SE3 becomes HIGH and thus the analog switch S3 is enabled. With SE4 at LOW level and SE5 at HIGH level the output of an NAND gate G9 for generating the switch control signal SE6 becomes LOW. That is, the switch S6 is disabled. That is, when the clock oscillator 21 is operated during the time period other than the conversion cycle, the switches S3 and S5 are both enabled. As apparent from FIG. 4 this state corresponds to the state in the first subperiod I-2 in the first conversion cycle. As evident from FIG. 5, at this time the reference voltage Er is applied through the inverting amplifier A2 to the integrator, the integrator output rises from the level $e_r$ and the front half portion of the pre-conditioning cycle is started. Since the integrator output rises, the comparator output $V_c$ is HIGH level. When the counter C4 generates an overflow pulse, the flip-flop F2 is reset. As a result, the clock generator 21 is disabled. As a result of the resetting of the flip-flop F2 the output of AND gate G11 becomes HIGH and the OR gate G7 produces a switch enable signal SE2, resulting in SE3 becoming LOW. The output of AND gate G13 becomes LOW and the output SE5 of the OR gate G8 becomes LOW. Since outputs SE4 and SE5 are both LOW, the output of NAND gate G9 becomes HIGH, causing the switch S6 to be enabled. That is, when the clock oscillator 21 is disabled, the analog switches S2 and S6 are enabled. As apparent from FIG. 4, this state corresponds to the state in the phase I-2' of the first conversion cycle. At this time, the reference voltage $E_r$ is applied through the noninverting amplifier A1 to the integrator as understood from FIG. 5, the output of the integrator falls during the rear half portion of the preconditioning cycle. When the output of the integrator reaches the comparison level $e_r$ the output $V_c$ of the comparator becomes LOW. Because the output of the gate G3 becomes LOW, the flip-flop F2 is set to cause the clock generator 21 to be enabled. In this way, the next pre-conditioning cycle begins.

The conversion operation will now be given below.

In order to start the conversion operation it is necessary to apply a conversion start pulse sp. The start pulse sp is supplied to the set input of flip-flop F0 and, as shown in FIGS. 2B and 2C, the flip-flop F0 is set by the negative-going edge of start pulse sp. At the end of the rear half portion of the pre-conditioning cycle the flip-flop F2 is set and thus the flip-flop F0 is reset. As a result, the flip-flop F5 and F7 are both set as shown in FIGS. 2D and 2H. When the flip-flop F5 is set, the clock oscillator 21 is always enabled during the conversion operation irrespective of the output state of flip-flop F2. The clock oscillator 21 starts its oscillation simultaneously with the setting of the flip-flop F5. At the same time when the flip-flop F0 is reset, the counters C1 to C3 and C5 are reset to zero. Since at this time outputs F7Q, F4-$\overline{Q}$ and F5-Q to the AND gate G4 for generating the switch control signal SE1 are all in the HIGH level the switch S1 is enabled. The output F4-$\overline{Q}$ is coupled through an inverter I to the AND gate G5, the signal SE4 from the AND gate G5 is at LOW level and the switch S4 is disabled. When the signal SE1 is at HIGH level, the signal SE3 is at LOW level. Since F5-$\overline{Q}$ and F5-Q are both at LOW level the output SE2 of OR gate G7 is at LOW level. With F3-Q and F5-$\overline{Q}$ at LOW level, the signal SE5 is at low level. With signals SE4 and SE5 at LOW level the signal SE6 is HIGH, enabling the switch S6. That is, an integration operation corresponding to the first phase of the first conversion cycle I is started. During this period an unknown analog signal $E_x$ is applied to the noninverting amplifier A1. With F7-Q at HIGH level the AND gate G14 is enabled to permit clocks $\phi$ to be coupled to the counter C1. with F3-Q at LOW level and the AND gate G15 is disabled, preventing the clocks $\phi$ from being applied to the counter C2.

When F3-Q and F6-Q both are at LOW level the AND gate G16 is disabled, preventing clock pulses $\phi$ from being supplied to the reversible counter C3. With F7-$\overline{Q}$ at LOW level the AND gate G1 is disabled, inhibiting supply of clocks φ to the output reversible counter C5. That is, during the first period I-1 only the counter C1 counts clocks φ.

At the elapse of time T0, the flip-flop F7 is reset by the output of counter C1. When flip-flop F7 is reset the flip-flop F3 is reset.

With F3-Q and F5-Q both at HIGH level, the signal SE5 goes HIGH. With the flip-flop F7 in the reset state the signal SE1 goes LOW. As a result, signals SE3 and SE5 go HIGH and the first phase I-2 of the second cycle is started. During this period the reference voltage $E_r$ is applied through the noninverting amplifier A2 to the integrator, causing the integrator output to ramp up. When the unknown analog signal $E_x$ is negative the output $V_c$ of the comparator at the end of the first period goes HIGH, causing AND gate G15 to be enabled to permit the counter C2 to count the clocks φ. With F5-Q and F7-$\bar{Q}$ both at HIGH level th gate G1 is enabled to cause the counter C5 to count clocks φ. At this time, F3-Q and F5-Q are both at HIGH level and F4-Q at LOW level. Thus, the output of an exclusive OR gte G17 is HIGH. Accordingly, the reversible counter C5 is counted up. When the counter C2 measures the time $t_d$, the flip-flop F3 is reset. The flip-flop F6 is set by the resetting of flip-flop F3.

When the flip-flop F6 is so set, the output of gate G10 becomes HIGH and thus SE2 becomes HIGH. When flip-flop F3 is reset, the output of gate G13 becomes LOW and thus SE5 goes LOW. When SE2 becomes HIGH, SE3 goes LOW. When SE5 goes LOW, SE6 goes HIGH. That is, when the counter C2 measures the time $t_d$, the switches S2 and S6 are enabled and the integration operation corresponding to the second phase II-2' is started. As will be understood from FIG. 5, in the second phase II-2' the reference voltage $E_r$ is applied through the noninverting amplifier A1 to the integrator, the output of integrator falls as shown in FIG. 2A.

In the second phase U-2' of the first conversion cycle I, F4-$\bar{Q}$ and F6-Q are both in HIGH level and AND gate G16 is enabled to permit reversible counter C3 to count clocks φ. Since, in this case, F4-$\bar{Q}$ is at HIGH level, the counter C3 is counted up. Since F5-Q and F7-$\bar{Q}$ are HIGH the AND gate G1 is enabled to permit the reversible counter C5 to count clock φ.

With F4-Q and F3-Q both in LOW level the output of exclusive OR gate G18 becomes LOW, resulting in the counter C5 being counted down. When the output of integrator falls during the second phase I-2' and crosses the comparison level $e_r$, the output $V_c$ of comparator varies from HIGH to LOW level. As a result, the output of AND gate G18 varies from HIGH to LOW level and thus the flip-flop F6 is reset. As a result, the AND gate G16 is sisabled and the counter C3 stops its counting operation. That is, a length of time corresponding to the second phase I-2' is stored in the reversible counter C3.

When the unknown analog signal $E_x$ is positive, the integrator output at the end of first phase I-1 is negative and thus the comparator output is at LOW level. In consequence, the AND gate G15 is disabled and the counter C2 does not count clocks φ, unlike the case where the unknown analog signal $E_x$ is negative. When the unknown analog signal is positive, the output of integrator rises during the first phase I-2. When the integrator output crosses the level $e_r$, the output $V_c$ of comparator varies from LOW to HIGH level. As a result, the AND gate G15 is enabled and the counter C2 counts clocks φ. When the counter C2 counts the time $t_d$ the same operation as when the unknown analog signal is positive is effected. For this reason, the integrator output falls during the second subperiod I-2' and at the point of time when it crosses the comparison level $e_r$, the integration operation corresponding to the second phase I-2' is terminated. When the unknown analog signal $E_x$ is positive, during the first phase I-2 the reversible counter C5 is counted up, and during the second phase I-2' counted down, like the case where the unknown analog signal is negative. A length of time corresponding to the second phase I-2' is stored in the reversible counter C3.

At the end of the first conversion cycle I the integrator output $V_c$ varies from HIGH to LOW level and thus the flip-flop F4 is set and flip-flop F6 reset. Since the output F4-Q' of gate G19, which becomes HIGH only during the first conversion cycle, and the output $V_c$ of comparator become LOW, the flip-flop F7 is set. As a result, switch control signals SE3 and SE4 become HIGH and the analog switches S3 and S4 are enabled. Therefore, the unknown analog signal $E_x$ is supplied through the noninverting amplifier A2 to the integrator to start integration operation of the first phase II-1 of the second conversion cycle. The unknown analog signal integration time in the first phase II-1 of the second conversion cycle is the same as that in the first phase of the first conversion cycle and is produced by the counter C1. Since in the second conversion cycle the flip-flop F4 is set the output of AND gate G19 becomes LOW. In consequence, the AND gate G15 is disabled and the counter C2 does not perform any counter operation during the second conversion cycle.

When the counter C1 measures the time $T_0$ the flip-flop F7 is reset and thus the flip-flop F3 is set. For this reason, switch control signals SE3 and SE5 become HIGH and the analog switches S3 and S5 are enabled. The reference voltage $E_r$ is applied through the inverting amplifier A2 to the integrator to start the integration operation of the first phase II-2 of the second conversion cycle. During the first subperiod II-2 outputs F4-Q, F3-Q and F5-Q are all at HIGH level and thus the output of exclusive OR gate G17 becomes. In consequence, the counter C5 is counted down. Since F4-$\bar{Q}$ is at LOW level, the reversible counter C3 is counted down. The reversible counter C3, which has been counted up during the first subperiod I-2 of the first conversion cycle and has stored the time width $T_x$, is counted down during the first phase II-2 of the second conversion cycle and after lapse of the time $T_x$ the counter C3 delivers a borrow signal, resetting the flip-flop F3. Whent the flip-flop F3 is reset, the flip-flop F6 is set. With the flip-flop F6 in the reset state control signals SE2 and SE6 becomes a HIGH level, causing the analog switches S3 and S6 to be enabled. As a result, an integration operation corresponding to the second phase of the second conversion cycle is started. In the second phase II-2' the reference voltage $E_r$ is supplied through the noninverting amplifier A1 to the integrator and thus the output of the integrator falls toward the comparison level $e_r$. Because in the second phase II-2' of the second conversion cycle F4-Q and F5-Q are both at the HIGH level the output of the exclusive OR gate G17 becomes a HIGH level and consequently the reversible counter C5 is counted up. Since the output $V_c$ of the comparator becomes a LOW level the moment the comparator output $V_c$ crosses the comparison level $e_r$, the flip-flop F5 is reset by the output of the AND gate G20. When this occurs, the AND gate G1 connected to the input of the reversible counter C5 is disabled and the counter C5 stops its counter operation. At this time, the count number of the counter C5 corresponds to the digital value of the unknown analog signal $E_x$. If during the first conversion cycle the reversible counter C5 delivers a borrow signal by its up-count and down-count operation the flip-flop F1 is set by this signal and F1-$\bar{Q}$ becomes a low level, indicating that the unknown analog signal is in the negative level.

Because at the end of the second conversion cycle the flip-flop F5 is reset as mentioned above, the flip-flop F4 is reset by the output of an OR gate G21. The comparator output $V_c$ becomes a LOW level and thus the flip-flop F6 is reset and the flip-flop F2 set. As a result, the above-mentioned pre-conditioning cycle is restarted.

Figure 6:
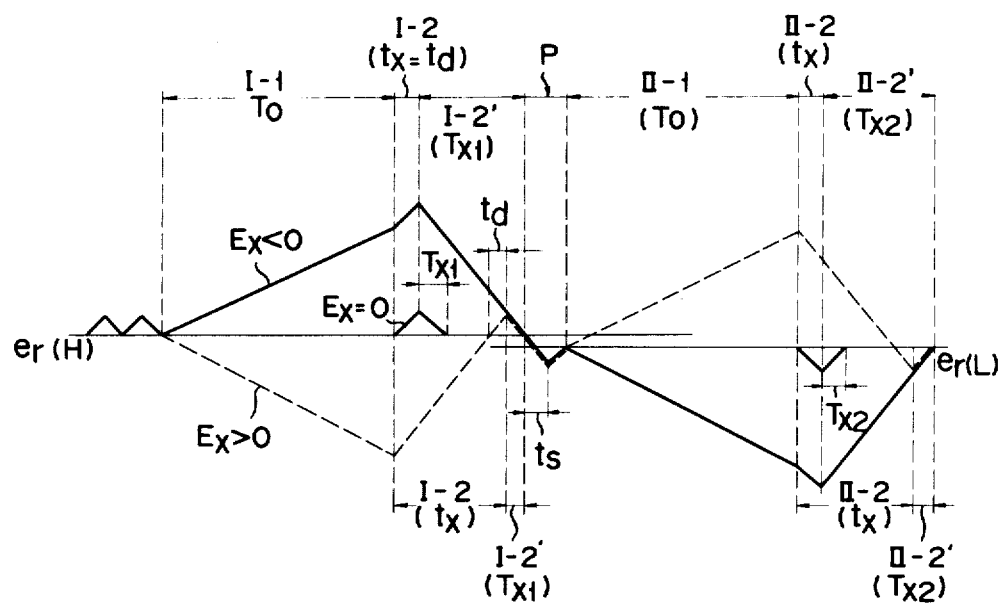
FIG. 6 is an output waveform of an integrator of a converter according to another embodiment of this invention.

FIG. 6 shows the output waveform of an integrator which is not influenced by the hysteresis of the comparator. $e_r(H)$ and $e_r(L)$ in FIG. 6 show two comparison levels of the comparator having hysteresis. Unlike the above-mentioned embodiment, a period p is added between the first conversion cycle and the second conversion cycle. During this period the comparison level is changed from $e_r(H)$ to $e_r(L)$. Unlike the above-mentioned embodiment a time width stored in the first conversion cycle is the time width $t_x$ of the phase I-2 and the time width so stored is used to exactly realize the phase II-2 of the second conversion cycle which is the same in time duration as the phase I-2. The remaining operation is the same as in the first embodiment. The conversion equation can be expressed as follows:

$$\frac{E_x}{E_r} = \frac{T_{x1} + T_{x2} - 2t_x}{2T_0}$$

Figure 7:
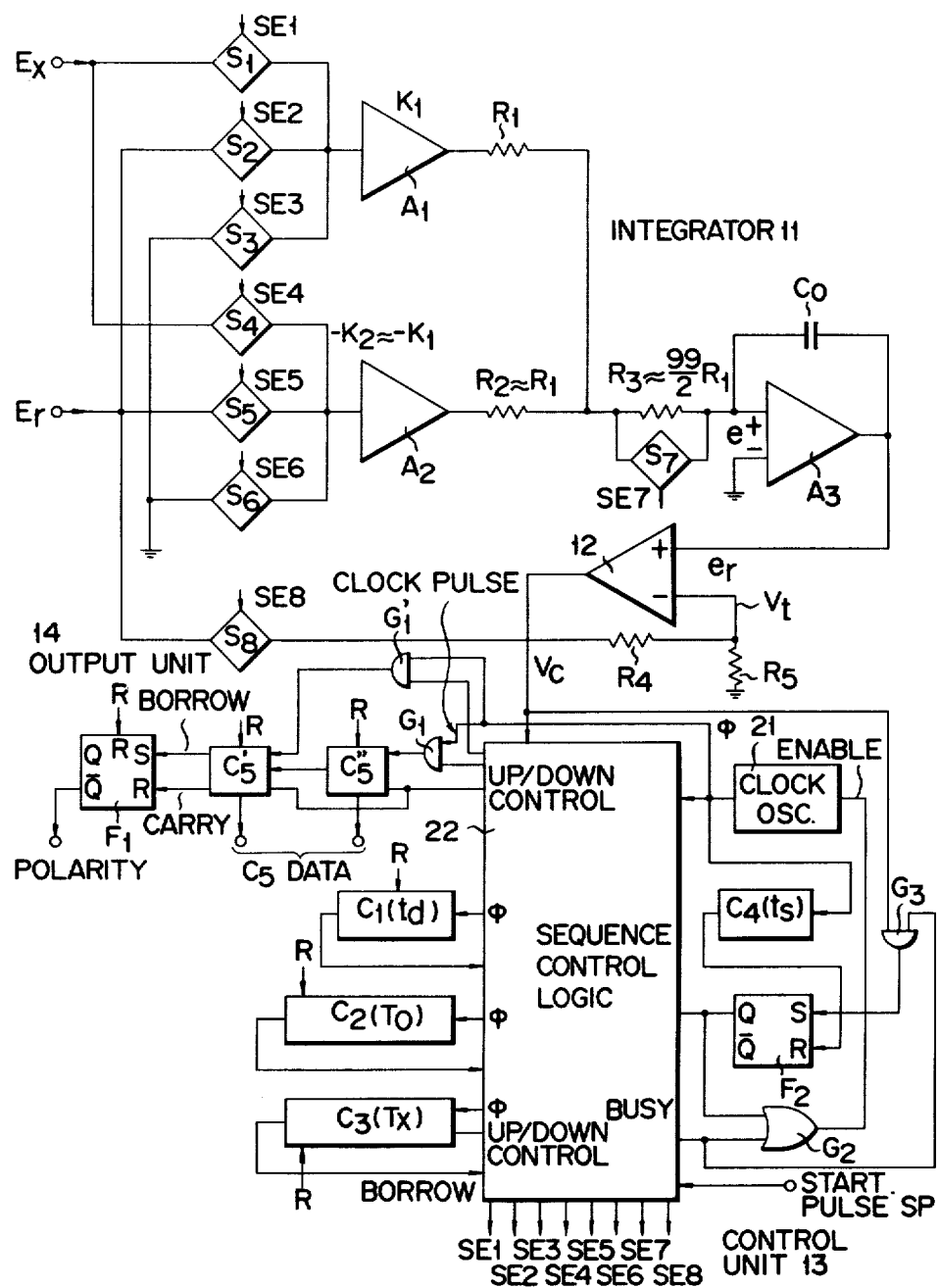
FIG. 7 shows a circuit of a converter according to another embodiment of this invention.

The integrating type analog-to-digital converts of this invention can readily count the integration time of the reference voltage, at high speed. In consequence, they can be modified to a high-speed, integrating type analog-to-digital converter, the circuit diagram of which is shown in FIG. 7.

FIG. 8 shows an output waveform of the integrator. The second period for integrating the reference voltage is divided into phases I-2' and I-2", and II-2' and II-2". The time width $t_x$ of the phase I-2 is stored and is equal to the time interval of the phase II-2. The time $T_{x1}$ of the phase I-2' is stored in a register in the sequence control circuit 22. At the start of the phase II-2' time the contents of the register is read onto the counter C3 to permit formation of the time width of the phase II-2' which is equal to that of the phase I-2'. That is, in this embodiment the time widths of the phases I-2 and I-2' are stored. The conversion equation is expressed as forllows:

$$\frac{E_x}{E_r} = \frac{(T_{x1} + T_{x2}) + 100(2T_{x1} - 2t_x)}{2T_0}$$

In the phase I-2' the switch S8 is closed and the comparison level of the comparator 12 becomes a level $V_t$ and the phase I-2' is terminated when the output of the integrator 11 reaches the level $V_t$. In the phases I-2" and the II-2" the switch S is opened and the integrator resistance is equivalently increased to a 100-fold and thus 1/100 $E_r$ is integrated equivalently. The counter C5 is divided into C5' and C5" sections and the count capacity of the section C5" is 100. In the phases I-2, I-2', II-2 and II-2', clock pulses are directly counted, after passed through the gate G'1, to the "100 fold" higher digit position C'5. In the phases I-2" and II-2" the clock pulses are counted to the lower digit position C"5 connected to the higher digit position. The contents of the reversible counter C5 are an analog-to-digital conversion value of the unknown analog voltage.

What is claimed is:

1. A method for converting an unknown analog voltage to a digital value comprising the steps of:
   (1) executing first and second conversion cycles, said first and second independent conversion cycles, each conversion cycle comprising integrating an unknown analog voltage over a first time period which is the same for both of said conversion cycles and integrating a reference voltage over a second time period which is the same for both of said conversion cycles, said second time period of each of said first and second conversion cycles comprising first and second subperiods, the polarities of the unknown analog voltages in the respective first periods of said first and second conversion cycles being opposite to each other, the polarities of the reference voltage in the respective first and second subperiods of the second period of each of said first and second conversion cycles being opposite to each other, an integration output level at the begining of the first period of each of the first and second conversion cycles being the same as an integration output level at the end of the second period thereof, a predetermined subperiod of the first conversion cycle being equal in time duration to a corresponding predetermined subperiod of the second conversion cycle in which the polarity of the reference voltage is opposite to that in the predetermined subperiod of the first conversion cycle, and
   (2) counting clock pulses of predetermined frequency in a first direction in the predetermined subperiods of said first and second conversion cycles and in a second direction during the other subperiods of the first and second conversion cycles.

2. The method according to claim 1, in which in the second period of each of the first and second conversion cycles an integration operation in the respective first and second subperiods is sequentially effected, the polarity of the reference voltage in the first and second subperiods of the first conversion cycle being the same as that in the first and second subperiods of the second conversion cycle.

3. The method according to claim 1 in which in the second period of each of the first and second conversion cycles an integration operation in the first and second subperiods is sequentially effected, the polarity of the reference voltage in the first and second aubperiods of the first conversion cycle being opposite to that in the first and second subperiods of the second conversion cycle.

4. A method for converting an unknown analog voltage to a digital signal using the unknown analog voltage of either polarity and a reference voltage of a single polarity, comprising the steps of:
   (1) applying an unknown analog voltage to an integrator during a first period of predetermined time duration and integrating it from a predetermined level;
   (2) applying a reference voltage to a first inverting amplifier and supplying an output of the first inverting amplifier in a second time period to the integrator for integration in one direction, the output of the integrator at the end of the second time period having a predetermined polarity with respect to said predetermined level;

(3) counting clock pulses by a reversible counter in the first direction during the second time period;

(4) applying after the end of the second time period the reference voltage to the integrator during a third time period and integrating it to a predetermined level;

(5) counting the clock pulses by the reversible counter in a second direction during the third time period;

(6) applying an unknown analog voltage to a second inverting amplifier and supplying the output of the second inverting amplifier to the integrator during a fourth time period equal in time duration to the first time period to integrate it from said predetermined level;

(7) applying the reference voltage to the second inverting amplifier to supply the output of the second inverting amplifier to the integrator during a fifth time period equal in time duration to the third time period to integrate it, the polarity of the integrator output at the end of the fifth time period being the same as that of the integrator output at the end of the second time period;

(8) counting the clock pulses by the reversible counter in the second direction in the fifth time period;

(9) applying the reference voltage to the integrator in a sixth time period and integrating it to the predetermined level; and

(10) counting the clock pulses in the sixth period by the reversible counter in the first direction.

5. An analog-digital converter comprising:
an integrator having first and second inputs;
a comparator connected to an output of the integrator;
a noninverting amplifier connected to the first input of the integrator;
an inverting amplifier connected to the second input of the integrator;
an unknown analog voltage source;
a unipolar reference voltage source;
a plurality of switch means connected between the voltage sources and the amplifiers;
a source of clock pulses of predetermined frequency;
conversion start pulse generating means;
circuit means for enabling the switch means in response to the conversion start pulse generating means, clock pulse source and comparator to execute first and second conversion cycles for analog-digital conversion, each of the first and second conversion cycles comprising a first period for integrating an unknown analog voltage over the same time period and a second period for integrating a reference voltage, each of the second periods of the first and second conversion cycles comprising first and second subperiods, the polarity of the unknown analog voltage in the respective first periods of the first and second conversion cycles being opposite to each other, the polarities of the reference voltage in the respective corresponding first and second subperiods of the second periods of the first and second conversion cycles being opposite to each other, the output level of the integrator at the start of the first period of each of the first and second conversion cycles being the same as that at the end of the second period thereof, the predetermined subperiods of the first conversion cycle being equal in time duration to those corresponding subperiods of the second conversion cycle in which the polarity of the reference voltage is opposite to that in the subperiod of the first conversion cycle; and reversible counter means for counting clock pulses of predetermined frequency in a first direction in each of the subperiods of the first and second conversion cycles and in a second direction in each of the remaining subperiods of the first and second conversion cycles, the count number at the end of the second conversion cycle having a digital value corresponding to the value of the unknown analog voltage.

6. A converter according to claim 5 in which said circuit means includes a reversible counter for counting the clock pulses in a first direction over the predetermined subperiod of the second period of the first conversion cycle and in a second direction over the predetermined subperiod of the second period of the second conversion cycle, the predetermined subperiods of the second conversion cycle being equal in time duration to the corresponding subperiods of the first conversion cycle.

7. A converter according to claim 5 in which said circuit means includes means for connecting the reference voltage alternatively to the noninverting and inverting amplifiers through the switch means.

8. A converter according to claim 5 further including means connected to said reversible counter means to indicate the polarity of the unknown analog voltage during the first and second conversion cycles according to a borrow signal and carry signal from the reversible counter means.

9. A converter according to claim 5, further including a counter having such a predetermined count capacity that when the output level of the integrator at the end of the first period of the first conversion cycle is at a first level a time duration of the first subperiod is determined by counting the clock pulses, and when the output level of the integrator at the end of the first period of the first conversion cycle is at a second level with respect to the initial level the remaining time of the first subperiod is determined after the output voltage of the integrator in the first period crosses the initial level of the first period.

10. An analog-digital converter comprising:
an integrator;
a comparator for comparing with a predetermined level an integrator output level connected to the output of the integrator to produce a first output level or a second output level;
clock pulse generating means;
means having first count means for counting clock pulses and adapted to apply an unknown analog signal to the integrator during a first time period determined by the first count means so as to integrate it from a predetermined level;
means for applying a reference voltage to the integrator during a second time period following the first period to cause the integrator to integrate the reference voltage, said applying means including second count means which is responsive to the comparator output level at the end of the first period and which when a comparator output at the first level determines the time duration of the second period by counting clock pulses and when the comparator output is at the second level determines the remaining time duration of the second period after the integrator output has reached a predetermined level as a result of integration, the polarity of the reference voltage during the second period being such that when the comparator output has the first level an integrator output has a polarity away from that of the second level and when the comparator output at the end of the first period has the second level the integrator output has a polarity toward the first level;

means for applying a reference voltage different in polarity from the reference voltage in the second period to the integrator during a third period following the second period to cause the integrator to integrate the reference voltage of opposite polarity until the integrator output becomes a predetermined level; and reversible counter means for counting clock pulses in a first direction during the second period and in the second direction during the third period.

11. An integrating type analog-to-digital converter comprising:

an integrator having first and second inputs;

a comparator connected to an output of the integrator;

a noninverting amplifier connected to the first input of the integrator;

an inverting amplifier connected to the second input of the integrator;

an unknown analog voltage source;

a unipolar reference voltage source;

a plurality of switch means connected between the voltage sources and the amplifiers;

a source of clock pulses of predetermined frequency;

a conversion start pulse generating means;

circuit means responsive to said conversion start pulse generating means, clock pulse source and comparator to drive the switch means in a predetermined sequence and execute the first and second conversion cycles for digital-to-analog conversion;

means for varying the comparison level of the comparator;

means connected to the integrator to equivalently vary the gain of the integrator, the first and second conversion cycles each comprising a first time period for integrating the unknown analog voltage during the same time period and a second time period for integrating the reference voltage, each of the second periods of the first and second conversion cycles comprising first, second and third periods, the polarities of the analog voltage during the respective first periods of the first and second cycles being opposite to each other, the polarities of the reference voltage during the respective first and second subperiods of the second periods of the first and second conversion cycles being opposite to each other, the polarity of the reference voltage during the third subperiod being the same as that of the reference voltage during the second subperiod, the integrator output level at the start of the first periods of the first and second conversion cycles being the same as that at the end of the third subperiods thereof;

the respective first and second subperiods of the first and second conversion cycles being such that their corresponding periods over which the reference voltage is integrated with an opposite polarity are equal in time duration to each other; and reversible counter means adapted to count the content of a higher digit position thereof in one direction during the first subperiod of the second period of the first conversion cycle and count the second subperiod time in a second direction, adapted to count the first subperiod time of the second conversion cycle in one direction and count the second subperiod thereof in a second direction, and adapted to count a lower digit position following the high digit position in a second direction during the third subperiod of the first conversion cycle and during the third subperiod of the second conversion cycle, a count value at the end of the second conversion cycle indicating a digital value of the unknown analog voltage.

12. An integrating type analog-to-digital converter according to claim 11, in which said circuit means includes first reversible counter means adapted to count clock pulses in one direction during the first subperiod of the first conversion cycle and count the first subperiod time of the second conversion cycle in the other direction to make the time duration of both subperiods equal to each other, and second reversible counter means adapted to count the second subperiod time of the first conversion cycle in one direction and count the second subperiod of the second conversion cycle in the other direction to make the time durations of both subperiods equal to each other.

13. An integrating type analog-to-digital converter according to claim 11, in which said circuit means is connected to means for equivalently varying the gain of the integrator, to a second gain smaller in value than a first gain value.

14. An integrating type analog-to-digital converter according to claim 11, in which said circuit means is connected to means for varying a comparison level of the comparator, to convert the comparison level to another level.

15. An integrating type analog-to-digital converter according to claim 11, further including means connected to said reversible counter means to indicate the polarity of the unknown analog voltage during the first and second conversion cycles by carry and borrow signals from the reversible counter means.

16. A converter for converting an unknown analog voltage to a digital signal using an unknown analog voltage of either polarity and a reference voltage of a single polarity which comprises:

an integrator having first and second inputs;

a comparator connected to the integrator;

a noninverting amplifier connected to the first input of the integrator;

an inverting amplifier connected to the second input of the integrator;

an unknown analog voltage source;

a unipolar reference voltage source;

a plurality of switch means connected between the voltage sources and the amplifiers;

a source of clock pulses of predetermined frequency;

conversion start pulse generating means;

circuit means responsive to the conversion start pulse generating means, clock pulse source and comparator to drive the switch means in a predetermined sequence and perform first and second conversion cycles for analog-to-digital conversion, in which the unknown analog voltage during a first period of the first conversion cycle is connected to the noninverting amplifier, the reference voltage is connected during a first subperiod of a second period to the inverting amplifier when the polarity of an integrator output at the end of the first period is at a first level and the integrator output is moved away from a second level, and when the polarity of the integrator output is at the second level the reference voltage is connected to the noninverting amplifier and the integrator output is moved away from the first level and during a second subperiod the integrator output is connected to that amplifier different from that connected during the first subperiod to effect integration to the predetermined level, and during the first period of the second conversion cycle corresponding in time duration to the first period of the first conversion cycle the unknown analog voltage is connected to the inverting amplifier, and during the first subperiod of the second period corresponding in time duration to the first subperiod of the first conversion cycle the reference voltage is connected to that amplifier different from that to which a reference voltage is connected during the first subperiod of the first conversion cycle, and during the second subperiod the reference voltage is connected to that amplifier different from that to which the reference voltage is connected during the second subperiod of the first cycle; and reversible counter means adapted to integrate clock pulses in one direction during the respective first subperiods of the first and second conversion cycles and count clock pulses in the other direction during the second subperiods of the first and second cycles, a count value at the end of the second conversion cycle indicating the digital value of the unknown analog voltage.

17. An integrating type analog-to-digital converter according to claim 14, further including means connected to said reversible counter to indicate during the first and second conversion cycles the polarity of the unknown analog voltage by a carry and a borrow signal from the reversible counter means.

18. An integrating type analog-to digital converter according to claim 14 further including counter means for producing the first subperiods of the first and second conversion cycles by counting clock pulses.

* * * * *